United States Patent [19]
Kinoshita

[11] Patent Number: 5,677,866
[45] Date of Patent: Oct. 14, 1997

[54] SEMICONDUCTOR MEMORY DEVICE

[75] Inventor: Yasushi Kinoshita, Tokyo, Japan

[73] Assignee: NEC Corporation, Tokyo, Japan

[21] Appl. No.: 739,445

[22] Filed: Oct. 29, 1996

Related U.S. Application Data

[63] Continuation of Ser. No. 361,675, Dec. 22, 1994, abandoned.

[30] Foreign Application Priority Data

Dec. 22, 1993 [JP] Japan ................................ 5-324161

[51] Int. Cl.$^6$ ................................................. G11C 11/00
[52] U.S. Cl. ............................ 365/156; 257/301; 365/154
[58] Field of Search .................................. 365/156, 154,
365/149, 182; 257/330, 301, 302, 303,
304, 305, 306, 307

[56] References Cited

U.S. PATENT DOCUMENTS

| | | | |
|---|---|---|---|
| 4,780,751 | 10/1988 | Nishimoto | 257/301 |
| 4,845,539 | 7/1989 | Inoue | 257/302 |
| 4,873,560 | 10/1989 | Sunami | 257/302 |
| 5,066,609 | 11/1991 | Yamamoto | 297/301 |
| 5,278,459 | 1/1994 | Matsui | 365/156 |
| 5,315,543 | 5/1994 | Matsuo | 257/301 |

OTHER PUBLICATIONS

Kudoh et al., "A New Full CMOS SRAM Cell Structure", *NEC Corporation*, pp. 67–70, (1984).

Hiramoto et al., "A 27 GHz Double Polysilicon Bipolar Technology On Bonded SOI With Embedded 58 µm$^2$ CMOS Memory Cells For ECL–CMOS SRAM Applications", IEEE, pp. 39–42, (1992).

"Ultra–High–Speed MOS Device", pp. 314–317, Baifu-kan.

*Primary Examiner*—A. Zarabian
*Attorney, Agent, or Firm*—Foley & Lardner

[57] ABSTRACT

In a semiconductor memory device constituted by bulk CMOS 6-Tr memory cells, a structure is realized which can maintain a high soft error immunity even if a power-supply voltage is lowered and a cell size is decreased. In order to realize this structure, a semiconductor memory device using a flip-flop which is constituted by CMOS transistors formed on a surface of a semiconductor substrate, includes a trench isolating region which has an interface between a first conductive well and a second conductive well formed in the semiconductor substrate and is formed from the surface of the semiconductor substrate in a direction of depth to have a predetermined planar shape and a predetermined depth, and a trench capacitor formed in the trench isolating region and separately connected to two memory nodes of a memory cell.

5 Claims, 11 Drawing Sheets

SEMICONDUCTOR MEMORY DEVICE

This application is a continuation of application Ser. No. 08/361,675, filed Dec. 22, 1994, now abandoned.

BACKGROUND OF THE INVENTION

1. Field of the Invention

The present invention relates to a semiconductor memory device and, more particularly, to a static semiconductor memory device (static memory) using a flip-flop constituted by CMOS transistors.

2. Description of the Prior Art

A static memory (CMOS SRAM) is an element which has bistable characteristics in a memory cell itself and employs a scheme (flip-flop) of storing information of "1" or "0" in correspondence with each stable state. A memory cell of this static memory is normally constituted by six elements.

As shown in FIG. 1, the circuit arrangement comprises a pair of driving transistors QL1 and QL2 and a pair of load elements R1 and R2 which constitute a flip-flop, and a pair of data transfer transistors QT1 and QT2 for connecting a pair of input/output nodes N1 and N2 of this flip-flop to a pair of complementary bit lines BL1 and BL2. Reference symbols WL and Vcc denote a word line and a power supply, respectively.

Memory cells of the static memory are classified into three types in accordance with the forms of the load elements R1 and R2 ("Ultra-High-Speed MOS Device", pp. 314–316, Baifu-kan). The first type is called a high-resistive load memory cell and serves as a passive load type in which load elements R1 and R2 are formed by resistors. The resistors consist of polysilicon and are deposited on the memory cell. The second type is called a TFT (Thin-Film polysilicon Transistor) memory cell, and serves as an active load type in which load elements R1 and R2 are formed by TFTs. The TFTs are respectively deposited on driving transistors QL1 and QL2 and data transfer transistors QT1 and QT2. The third type is called a bulk CMOS 6-Tr memory cell in which driving transistors QL1 and QL2, data transfer transistors QT1 and QT2, and reverse-polarity load transistors are arranged on a substrate.

The first high-resistive load memory cell has been widely used because of the small cell region and a small leakage current in a resistive load using polysilicon. As the degree of integration has been improved, however, the resistive load memory cell which uses polysilicon is not suitable due to a soft error caused by an α ray in the resistive load memory cell using polysilicon, and poor cell stability.

The third bulk CMOS 6-Tr memory cell has a small number of manufacturing steps, and a stable memory operation. The latest example using this is published in a paper (International Electron Devices Meeting Technical Digest, pp. 39–42, 1992). The basic structure is the same as that in the above reference. Generally, in a bulk CMOS 6-Tr memory cell, a load element is a p-type MOS transistor (to be referred to as "PMOS" hereinafter), and a driving element and a data transfer element are n-type MOS transistors (to be referred to as "NMOS" hereinafter). The PMOS is formed on the surface of an n-type well, and the NMOS is formed on the surface of a p-type well. The source of the load PMOS is connected to a power-supply voltage (Vcc), and the source of the driving NMOS is connected to ground (GND). Generally, an n-type well is fixed at the power supply potential (Vcc), and a p-type well is fixed at the ground potential (GND).

FIGS. 2 and 3 show planar arrangements of a bulk CMOS 6-Tr memory cell.

FIG. 2 shows an n-type well layer 8, a p-type well layer 7, $n^+$-type diffusion layers 1, $p^+$-type diffusion layers 2, gate electrode wiring lines 3, and contact holes 4. Reference numeral 3a corresponds to a word line shown in FIG. 1. Reference symbols QR1 and QR2 denote PMOSs serving as load elements R1 and R2; QL1 and QL2, NMOSs serving as driving transistors; and QT1 and QT2, NMOSs serving as data transfer transistors.

FIG. 3 shows metal Al wiring lines 6, on the first-layer surface, which serve as upper wiring lines above the gate electrode wiring lines 3, and via holes 5. Of the metal Al wiring lines 6 on the first-layer surface, reference numerals 6a and 6b denote ground wiring lines and a power supply wiring line for supplying a power to the memory cells. Metal Al wiring lines on a second layer 30 as shown in FIG. 4 are used as the ground wiring lines 6a through the via holes 5. The four metal Al wiring lines on the second layer are parallelly arranged in the longitudinal direction, and the two wiring lines at the central portion serve as the bit lines BL1 and BL2 shown in FIG. 1. FIG. 4 shows an arrangement taken along a line A–A' in FIG. 3.

The bulk CMOS 6-Tr memory cell requires insulating isolation between the p-type well and the n-type well in the memory cell for forming one bit. A portion representing a PN isolation width in FIG. 4 performs insulating isolation, and the width must be normally 3 μm or more. Therefore, the bulk CMOS 6-Tr memory cell has a cell area 4 to 5 times as large as that of the TFT type, preventing high integration.

In order to solve this problem, as published in, e.g., a paper (International Electron Devices Meeting Technical Digest, pp. 67–692, 1984), a trench isolation method, used for insulating isolation between the p-type well and the n-type well, for decreasing a cell area has been widely studied. However, the memory cell size is 2 to 4 times as large as that of the TFT type even by the trench isolation method, and the bulk CMOS 6-Tr memory cell is inferior in integration density to the TFT memory cell. Therefore, TFT memory cells are currently examined as static memory cells.

In the static memory (CMOS SRAM), with a decrease in gate length of a MOSFET on the order of deep submicron, a supply voltage must be lowered from the viewpoint of suppression of hot carrier effect, a decrease in power consumption, and the like. Needs for performance of SRAM devices have been changed from a large capacity to a low-voltage operation. For this reason, as the main problem of static memories, a margin for the low-voltage operation of a memory cell must be ensured, and soft error immunity must be improved in the low-voltage operation.

The soft error is a phenomenon which temporarily causes a failure in a memory. For example, high energy rays radiated from a small amount of radioactive substance which is contained in a material constituting an integrated circuit or a package, or cosmic rays present in the nature invert data stored in memory nodes of a memory cell. This mechanism is as follows. That is, radioactive rays incident on a memory cell generate electron-hole pairs, and the electron-hole pairs are attracted to a depletion layer region of a MOS transistor in an OFF state to charge the contact capacitances of the memory nodes. A failure is caused when the potential of a memory node at high level (NH) in the memory cell is lower than that of a memory node at low level (NL). The capacitance of the memory node in the memory cell is generally about 10 fF including an overlap capacitance. However, if this capacitance is decreased, the supply voltage is lowered, or the cycle time of a memory operation is shortened, the soft error immunity is reduced.

The bulk CMOS 6-Tr memory cell and the TFT memory cell are considered to have a high soft error immunity because a load element is an active element. In the TFT memory cell, however, since the performance (ON/OFF current ratio) of a TFT transistor is inferior to that of a bulk transistor, the soft error immunity is undesirably reduced with a decrease in power-supply voltage. In the bulk CMOS 6-Tr memory cell, the soft error immunity is also reduced with a decrease in power-supply voltage. In addition, the capacitance is mainly proportional to the area of a diffusion layer, so that a problem is posed by a decrease in capacitance with micro-patterning to reduce the soft error immunity.

SUMMARY OF THE INVENTION

The present invention has as its object to provide a semiconductor memory device (static memory) which is constituted by bulk CMOS 6-Tr memory cells and can maintain a high soft error immunity even if a power-supply voltage is lowered and a cell size is decreased.

In order to achieve the above object, according to the present invention, a semiconductor memory device using a flip-flop which is constituted by CMOS transistors formed on a surface of a semiconductor substrate, comprises a trench isolating region which has an interface between a first conductive well and a second conductive well formed in the semiconductor substrate and is formed from the surface of the semiconductor substrate in a direction of depth to have a predetermined planar shape and a predetermined depth, and a trench capacitor formed in the trench isolating region and separately connected to two memory nodes of a memory cell.

Since the trench isolating region is formed which has the interface between the first conductive well and the second conductive well formed in the semiconductor substrate and from the surface of the semiconductor substrate in the direction of depth to have a predetermined planar shape and a predetermined depth, the first conductive well and the second conductive well can be electrically isolated. Further, the trench capacitor formed in the trench isolating region is connected to the memory nodes of the memory cell formed on the surface of the semiconductor substrate and constituted by MOS transistors, thereby increasing the capacitance of the memory nodes.

DETAILED DESCRIPTION OF PREFERRED EMBODIMENT

Figure 1:
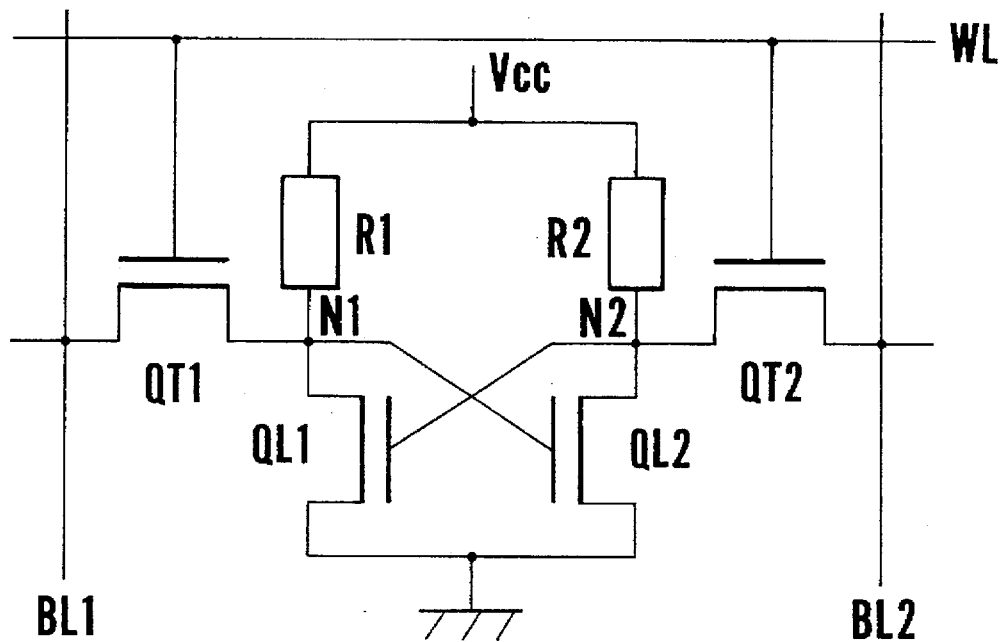
FIG. 1 is a circuit diagram showing an arrangement of a memory cell of a conventional static memory.
Figure 2:
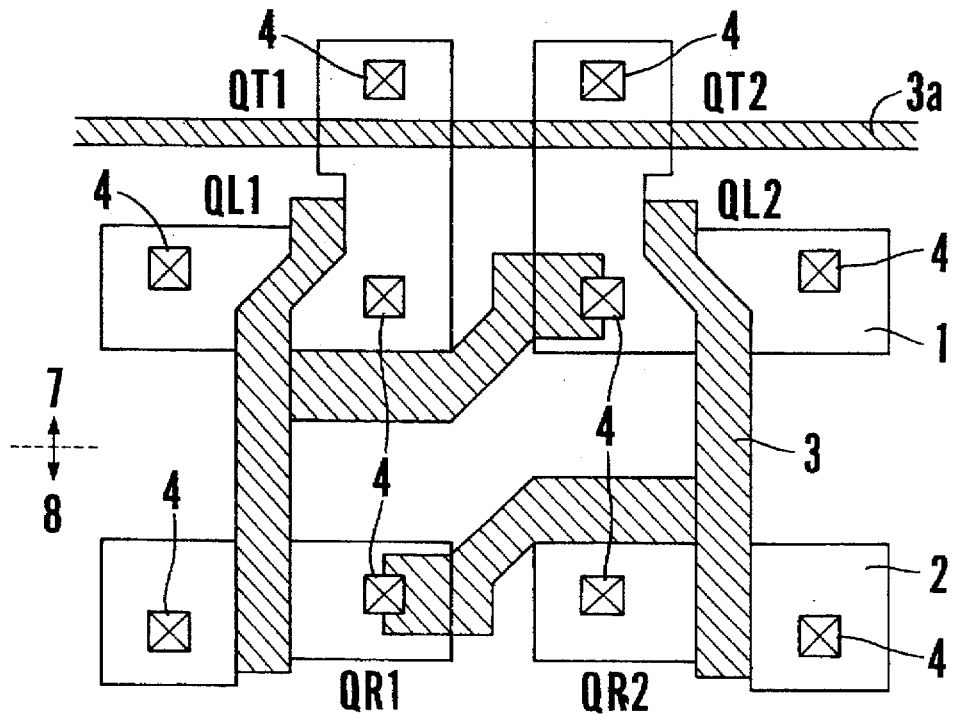
FIG. 2 is a plan view showing an arrangement of a bulk CMOS 6-Tr memory cell.
Figure 3:
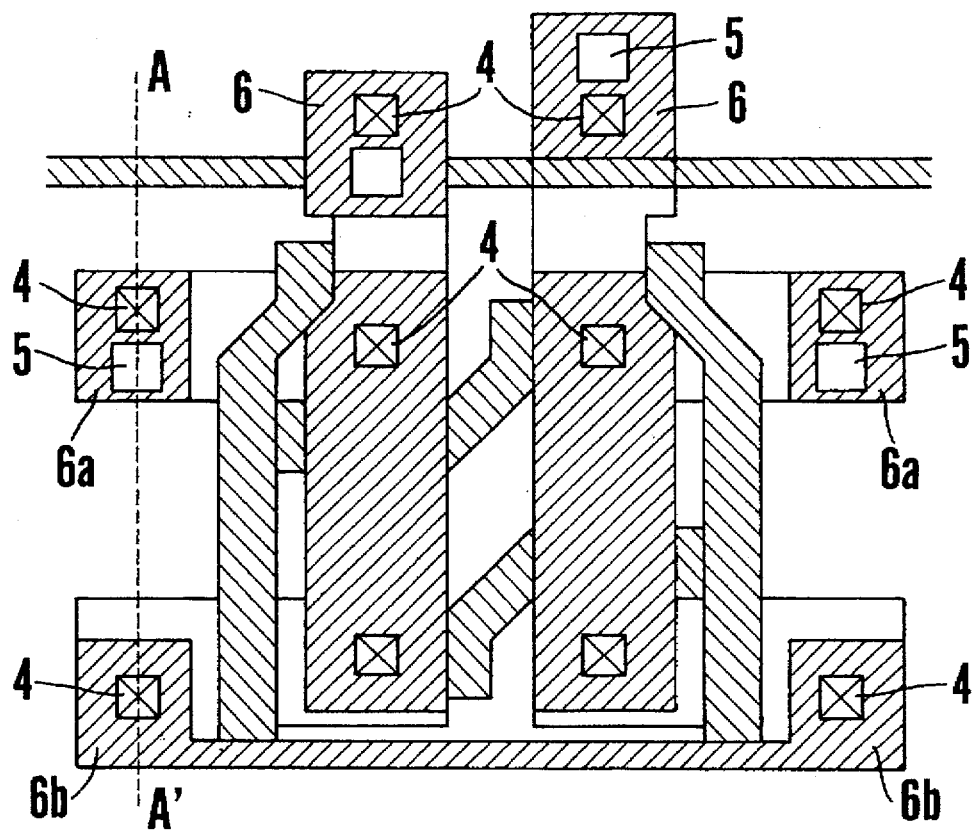
FIG. 3 is a plan view showing an arrangement of the bulk CMOS 6-Tr memory cell.
Figure 4:
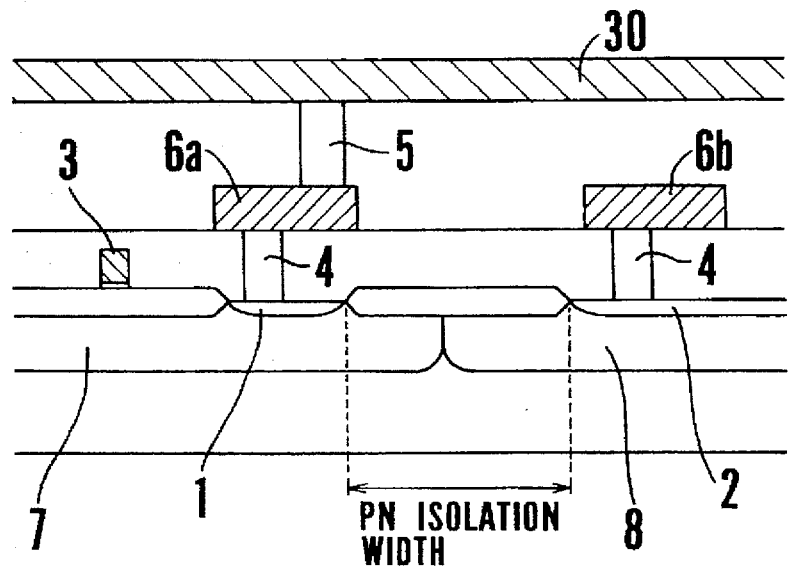
FIG. 4 is a sectional view showing an arrangement taken along a line A–A' in FIG. 3.
Figure 5:
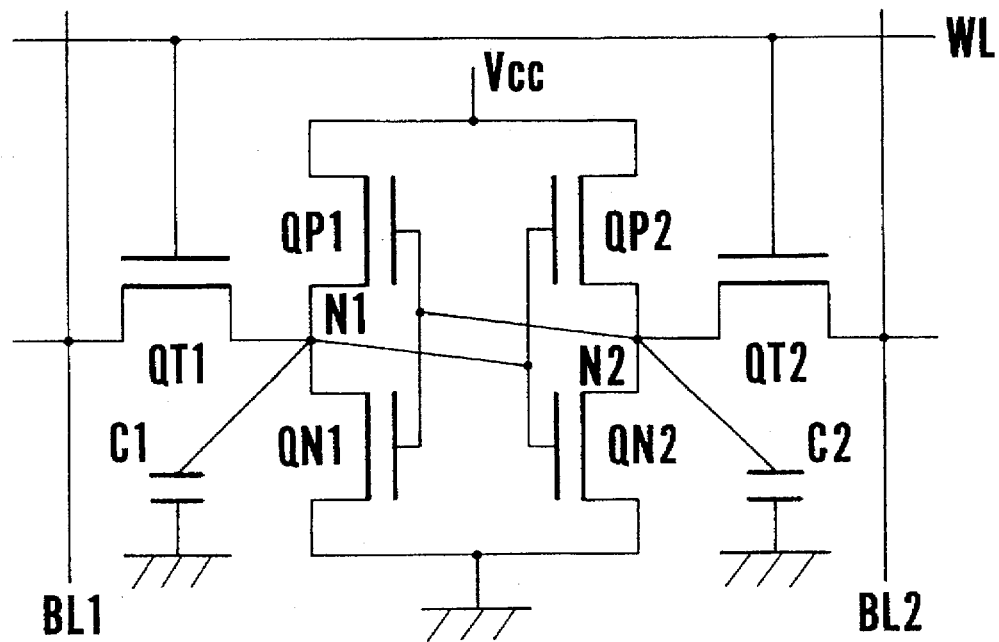
FIG. 5 is a circuit diagram showing an arrangement of a memory cell according to an embodiment of the present invention.

FIG. 5 shows a circuit arrangement according to an embodiment of the present invention. A memory cell of this embodiment is a bulk CMOS 6-Tr memory cell using a PMOS formed on the substrate as a load element.

Referring to FIG. 5, a pair of transistors QN1 and QN2 and a pair of transistors QP1 and QP2 are respectively driving NMOSs and load PMOSs, and constitute a flip-flop. Reference symbols QT1 and QT2 denote data transfer NMOSs which respond to a level of a word line WL. A pair of input/output nodes N1 and N2 of the flip-flop are connected to a pair of complementary bit lines BL1 and BL2 through the NMOSs QT1 and QT2. Note that reference symbol Vcc denotes a power supply.

The characteristic feature of the present invention is that the other terminal of one of capacitors C1 and C2 whose one terminal is electrically grounded is connected to a corresponding one of the input/output nodes N1 and N2. A potential at one terminal of the capacitor C1 or C2 need not be limited to the ground potential, and may be the power supply potential. In the following description, the potential at one terminal of each capacitor is the ground potential.

Figure 6:
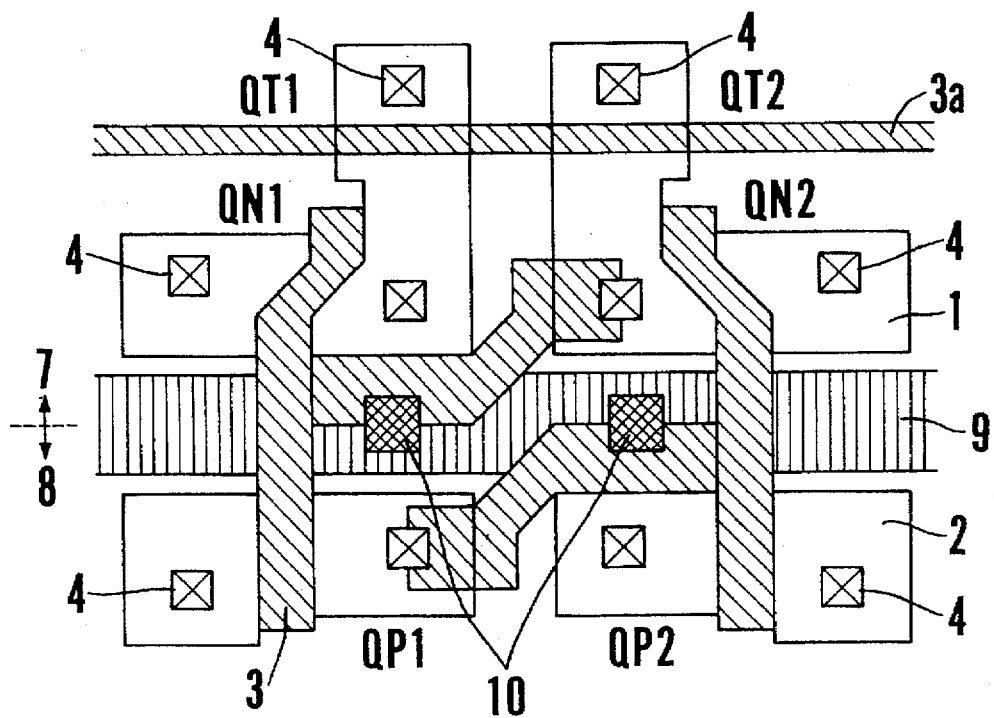
FIG. 6 is a plan view showing an arrangement of the embodiment shown in FIG. 5.
Figure 7:
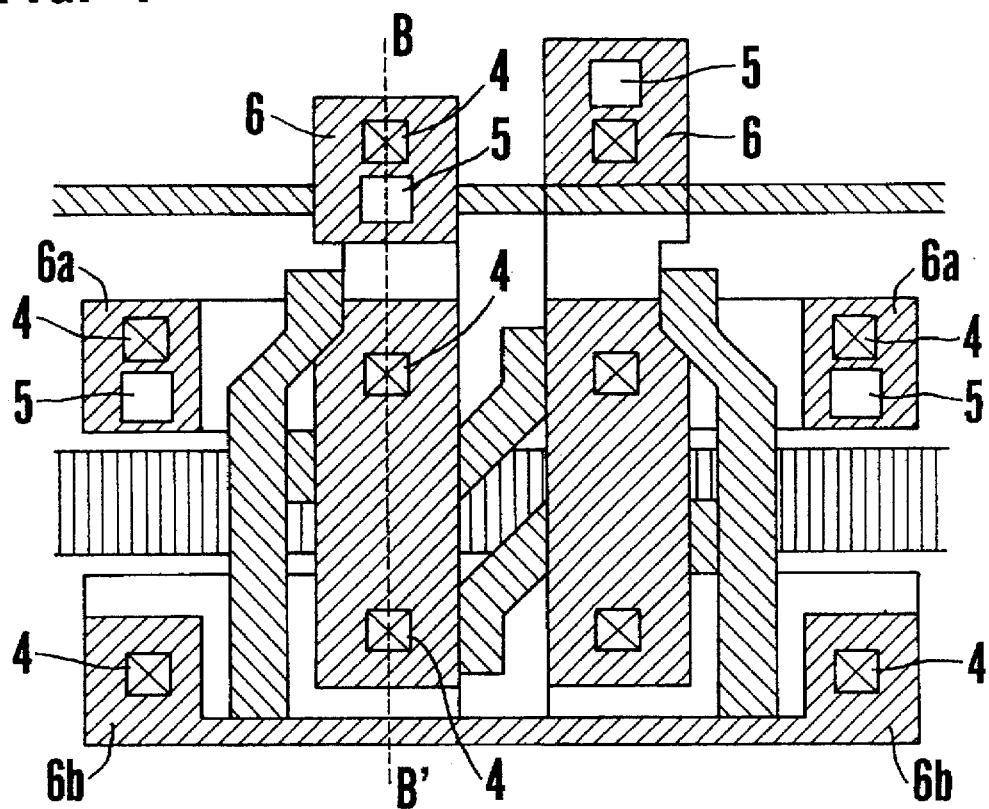
FIG. 7 is a plan view showing an arrangement of the embodiment shown in FIG. 5.

FIGS. 6 and 7 show $n^+$-type diffusion layers 1, $p^+$-type diffusion layers 2, gate electrode wiring lines 3, contact holes 4 for connecting the $n^+$-type diffusion layers 1, the $p^+$-type diffusion layers 2, or the gate electrode wiring lines 3 to metal Al wiring lines 6 on the first layer, a p-type well layer 7 in the substrate in which NMOSs are to be formed, an n-type well layer 8 in the substrate in which PMOSs are to be formed, a trench isolating portion 9 for electrically isolating the p-type well layer 7 from the n-type well layer 8, and a trench capacitor 10 formed in the trench isolating portion 9. Further, FIG. 7 shows via holes 5 for connecting the metal Al wiring lines 6 on the first layer to metal Al wiring lines (not shown; to be represented by reference numeral 30 in FIG. 8) on the second layer. Reference numeral 3a corresponds to the word line WL shown in FIG. 5. Reference symbols QP1 and QP2 denote load PMOSs; QN1 and QN2, driving NMOSs; and QT1 and QT2, data transfer NMOSs.

Figure 8:
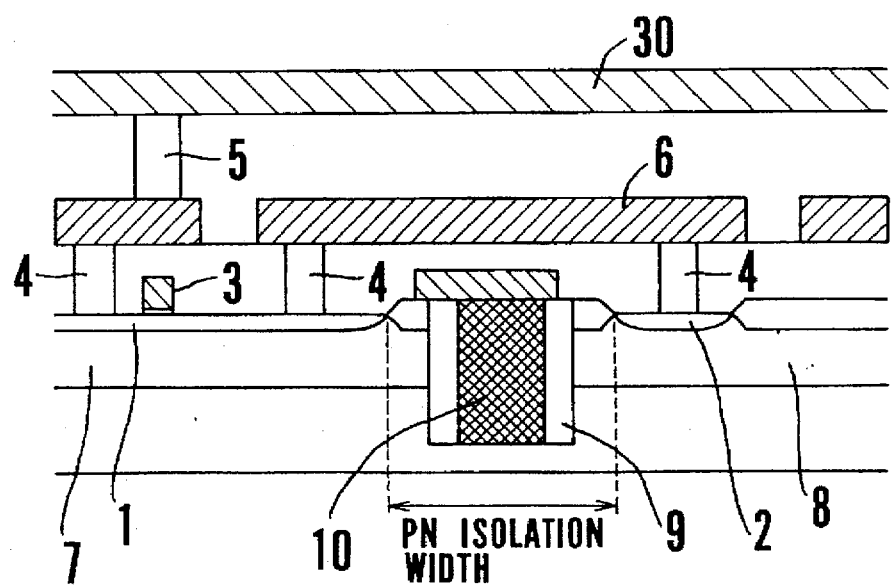
FIG. 8 is a sectional view showing an arrangement taken along a line B–B' in FIG. 7.

The four metal Al wiring lines 30 (shown in FIG. 8) on the second layer are parallelly arranged in the longitudinal direction on the via holes 5. The two wiring lines at the central portion are the bit lines BL1 and BL2 shown in FIG. 5. Ground wiring lines 6a are formed by the metal A1 wiring lines (not shown) on the second layer through the through holes 5, and a power supply wiring line 6b is formed by the metal Al wiring line 6 on the first-layer surface. FIG. 8 shows an arrangement taken along a line B–B' in FIG. 7.

The first example of the steps in manufacturing a memory cell according to this embodiment will be described below with reference to steps (a) to (f) in FIGS. 9A to 9F. The sections in FIGS. 9A to 9F are obtained by taking along the line B–B' in FIG. 7.

Figure 9A:
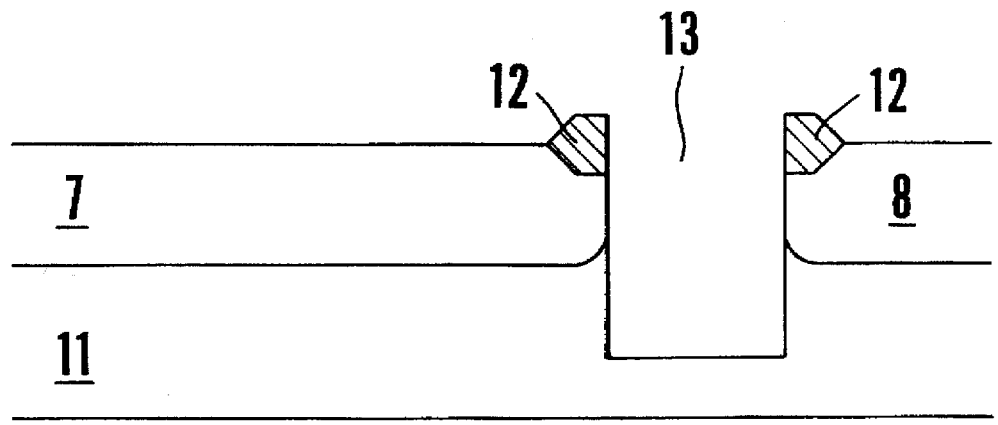
FIGS. 9A to 9F are sectional views showing an example of the steps in manufacturing a memory cell according to the present invention.

(a) The p-type well layer 7 and the n-type well layer 8 are formed in a p-type silicon substrate 11 by a well-known ion implantation method. Thereafter, an element isolating oxide film 12 having a thickness of 250 to 450 nm is formed by the LOCOS method. A slit-like groove 13 with a depth of 0.8 to 1.4 μm is formed to reach the p-type silicon substrate 11 through the element isolating oxide film 12, the p-type well layer 7, and the n-type well layer 8. In this step, the resultant structure except for an opening is masked with a photoresist to etch the oxide film to form a trench by micropatterning techniques such as optical exposure and dry etching (FIG. 9A).

Figure 9B:
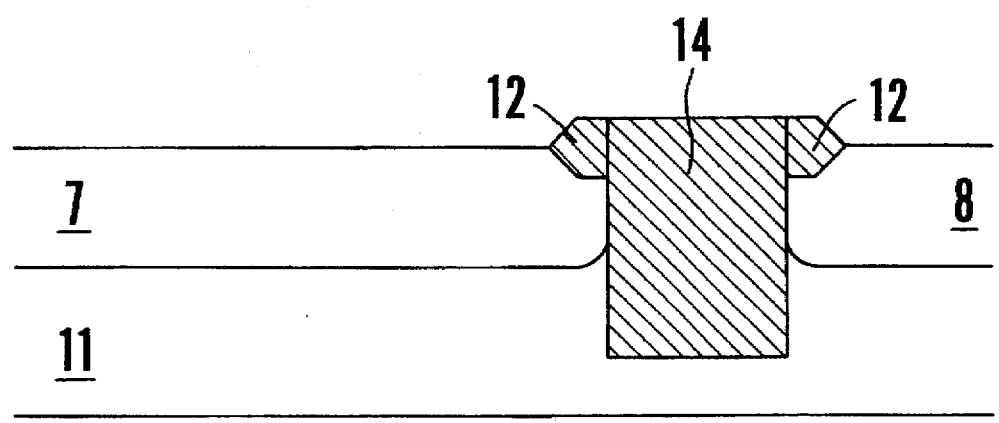

(b) An insulating film (e.g., an oxide film) 14 is buried in the slit-like groove 13 (FIG. 9B).

Figure 9C:
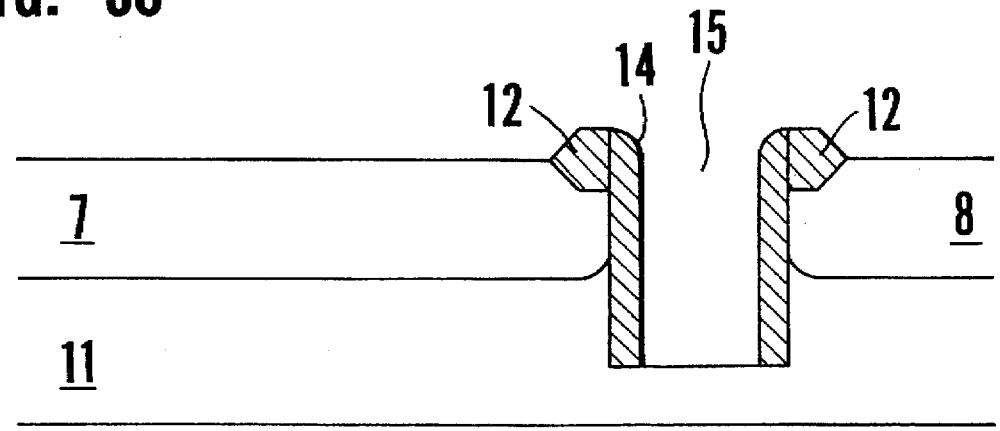

(c) By micropatterning techniques such as optical exposure and dry etching, one or a plurality of cylindrical grooves 15 are formed for two memory nodes present in the 1-bit memory cell. At this time, the insulating film 14 is etched so as to expose the p-type silicon substrate 11 at the bottom portion of the cylindrical groove 15 (FIG. 9C).

Figure 9D:
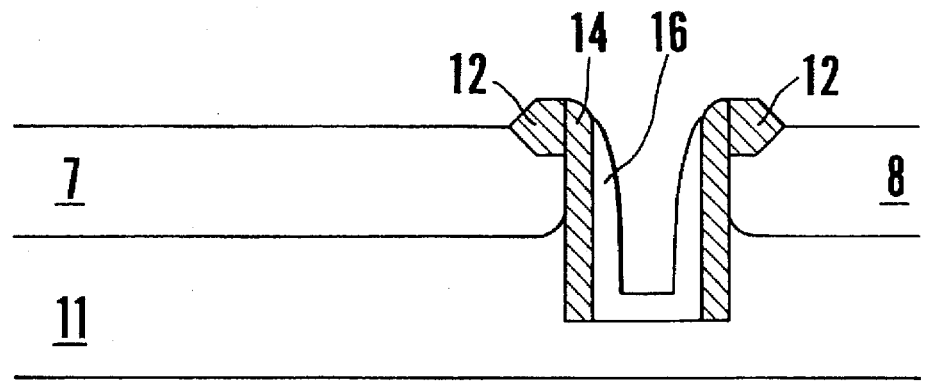

(d) A polysilicon film 16 is deposited to a thickness of 50 to 100 nm on the entire surface of the substrate. A resist which is used for optical exposure is deposited thereon. The entire resist is etched back to expose the polysilicon film on the surface of the substrate except for the cylindrical groove 15. Thereafter, the entire polysilicon film is etched back while the resist remains inside the cylindrical groove 15. The polysilicon film 16 which remains inside the cylindrical groove 15 is connected to the ground potential through the p-type silicon substrate 11 (FIG. 9D).

Figure 9E:
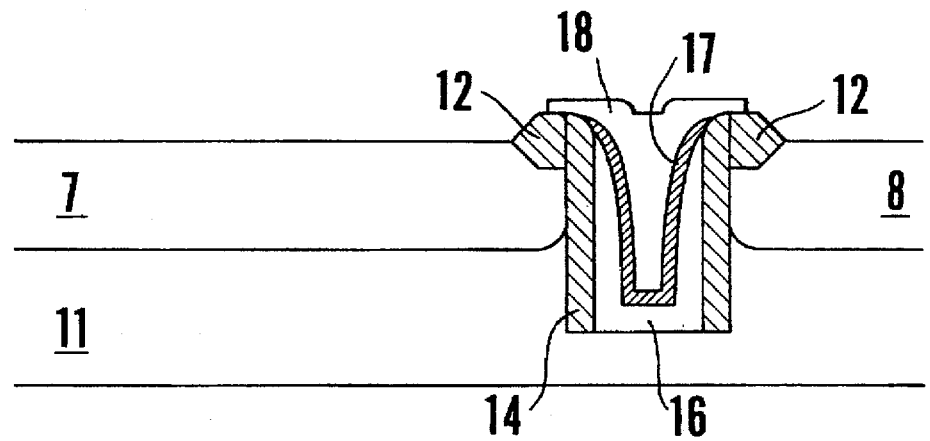

(e) A nitride film 17 which serves as a capacitor insulating film is deposited to a thickness of 5 to 10 nm on the entire surface of the substrate. The entire nitride film 17 is similarly etched back except for the nitride film 17 inside the cylindrical groove 15. The resultant groove 15 is buried with a polysilicon film 18 again (FIG. 9E).

Figure 9F:
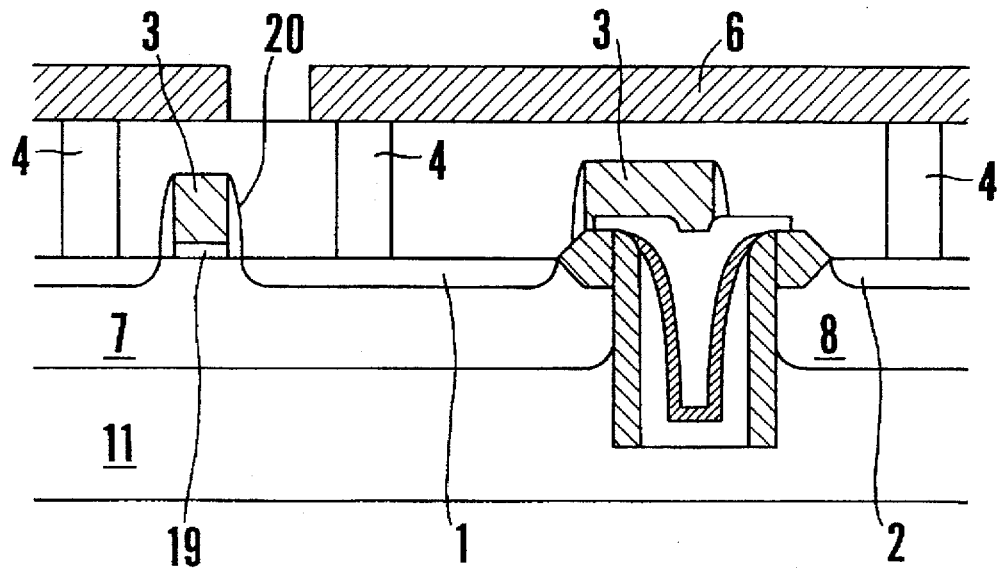

(f) A gate oxide film 19 is grown to a thickness of 50 to 100 nm on the entire surface of the substrate. By micropatterning techniques such as optical exposure and dry or wet etching, the resultant structure except for the opening is masked with a photoresist, and the gate oxide film on the cylindrical groove 15 is removed by oxide film etching. Then, polysilicon or polyimide which serves as a gate electrode of a MOS transistor is deposited on the entire surface of the substrate, and the resultant structure is patterned to form the gate electrode wiring lines 3. With this structure, the upper opening of the cylindrical groove 15 is connected to the memory nodes of the memory cell through the gate electrode wiring lines 3. In order to stabilize the characteristics of the MOS transistor, a side wall 20 consisting of the oxide film is formed on the side wall of each gate electrode wiring line 3. The n$^+$-type diffusion layer 1 and the p$^+$-type diffusion layer 2 are respectively formed in the p-type well layer 7 and the n-type well layer 8 by a well-known technique such as ion implantation. Thereafter, an interlayer film, the contact holes 4, and the metal Al wiring lines 6 on the first layer are formed (FIG. 9F).

When the nitride film 17 has a thickness of 10 nm in the cylindrical capacitor structure with a depth of 2 μm and a radius of 0.15 μm, the trench capacitor formed in the cylindrical groove 15 for p-n isolation has a capacitance value of 13 fF. This value is almost equal to a memory node value of the TFT memory cell or the bulk CMOS 6-Tr memory cell. For this reason, when the trench capacitor is connected to one memory node, the capacitance of the memory node is increased about 2 times as large as that of a conventional memory node.

Figure 10:
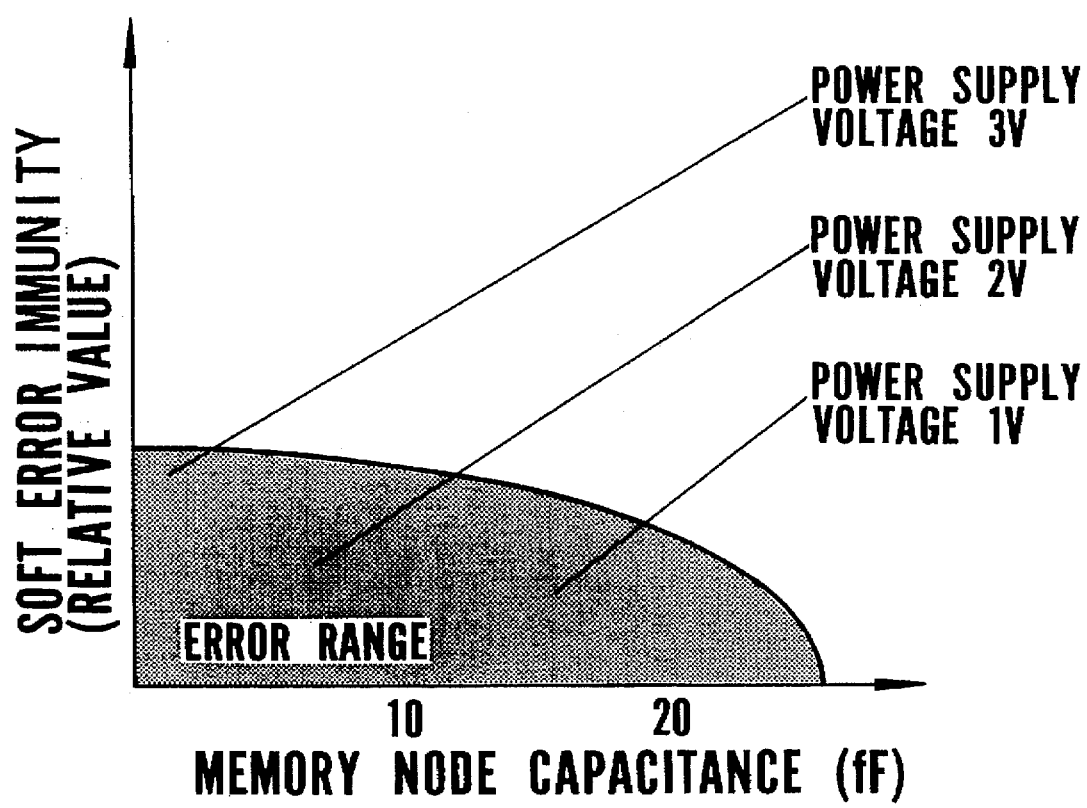
FIG. 10 is a graph showing a relationship between capacitances of a memory node and soft error immunity.

FIG. 10 shows a relationship between memory node capacitances (fF) at power-supply voltages of 1 V, 2 V, and 3 V, and soft error immunity (relative values).

The above example can also be realized by an arrangement of a Bi-CMOS integrated circuit which has features of both a CMOS transistor and a bipolar transistor with a high-speed operation and a high driving ability, and in which the bipolar transistor and the CMOS transistor are formed on the same substrate.

The second example of the steps in manufacturing a memory cell according to this embodiment will be described below with reference to steps (a) to (f) in FIGS. 11A to 11F. The sections in FIGS. 11A to 11F are obtained by taking along the line B–B' in FIG. 7.

Figure 11A:
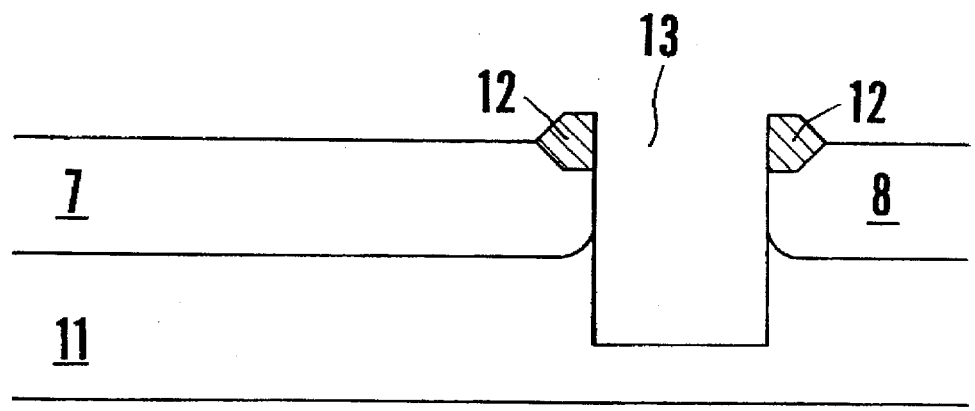
FIGS. 11A to 11F are sectional views showing another example of the steps in manufacturing a memory cell according to the present invention.

(a) Similar to the first example, the p-type well layer 7 and the n-type well layer 8 are formed on the p-type silicon substrate 11. Thereafter, the element isolating oxide film 12 with a thickness of 250 to 450 nm is formed by the LOCOS method. The slit-like groove 13 with a depth of 0.8 to 1.4 μm is formed to reach the p-type silicon substrate 11 through the element isolating oxide film 12, the p-type well layer 7, and the n-type well layer 8 (FIG. 11A).

Figure 11B:
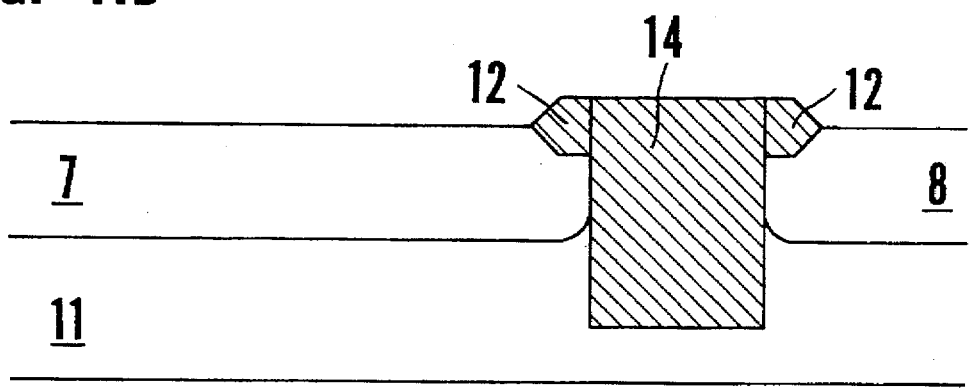

(b) The insulating film (e.g., an oxide film) 14 is buried in the slit-like groove 13 (FIG. 11B).

Figure 11C:
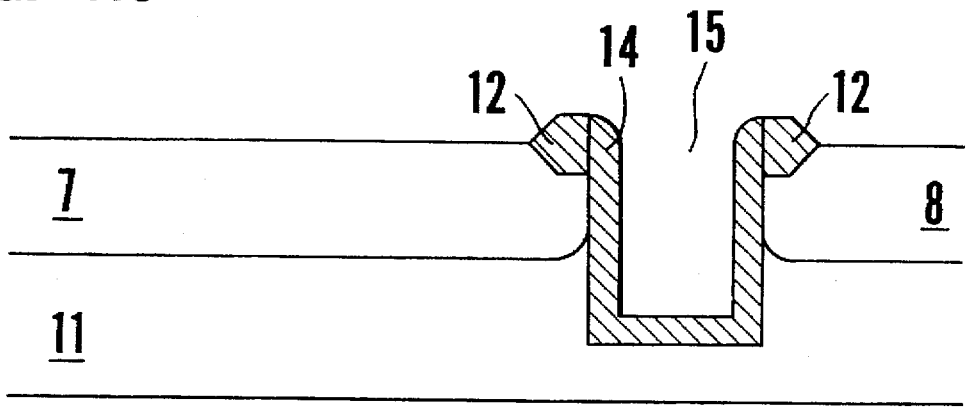

(c) Similar to the first example, one or a plurality of cylindrical grooves 15 are formed for two memory nodes present in the 1-bit memory cell. At this time, the insulating film 14 is etched to have a thickness of 50 to 100 nm so as not to expose the p-type silicon substrate 11 at the bottom portion of the cylindrical groove 15 (FIG. 11C).

Figure 11D:
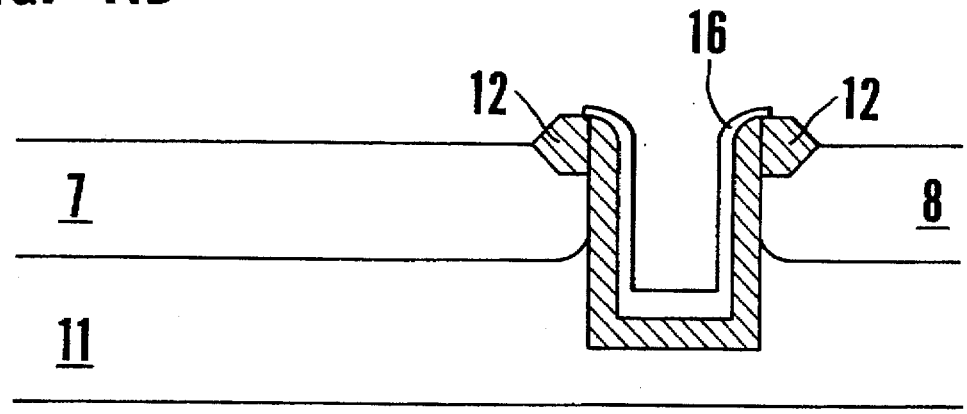

(d) The polysilicon film 16 is deposited to a thickness of 50 to 100 nm on the entire surface of the substrate. Then, similar to the first example, the deposited polysilicon film 16 is patterned. With this operation, the polysilicon film 16 with a thickness of 50 to 100 nm remains in the cylindrical groove 15. This polysilicon film 16 is used as a ground wiring line, and has a structure for supplying an external ground potential to a memory cell block (FIG. 11D).

Figure 11E:
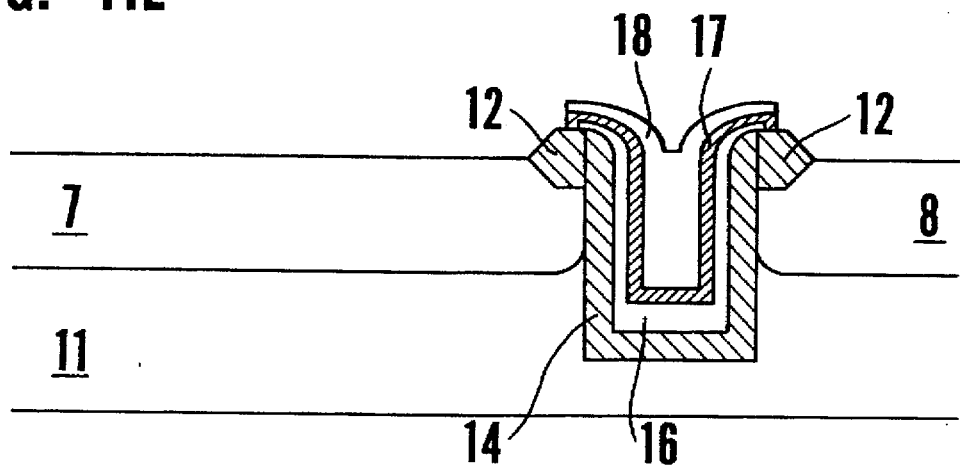

(e) Similar to the first example, the nitride film 17 which serves as a capacitor insulating film, and the polysilicon film 18 are deposited to thicknesses of 5 to 10 nm, and 100 to 200 nm, respectively. The resultant structure is patterned (FIG. 11E).

Figure 11F:
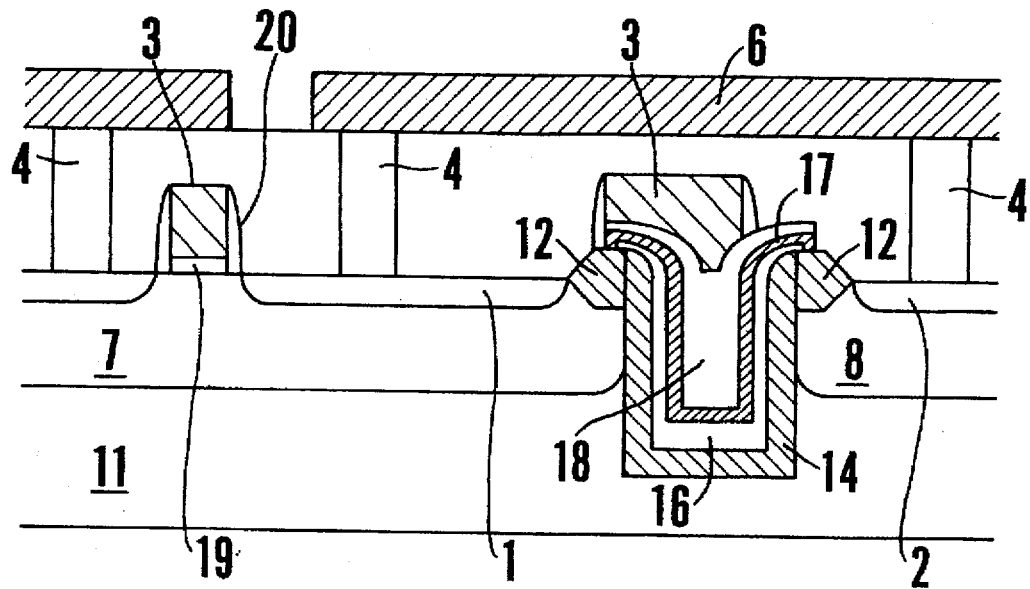

(f) The gate oxide film 19 is grown to a thickness of 50 to 100 nm on the entire surface of the substrate. Similar to the first example, the gate oxide film on the cylindrical groove 15 is removed. Then, polysilicon or polyimide which serves as a gate electrode of a MOS transistor is deposited on the entire surface of the substrate, and the resultant structure is patterned to form the gate electrode wiring lines 3. With this structure, the upper opening of the cylindrical groove 15 is connected to the memory nodes of the memory cell through the gate electrode wiring lines 3. In order to stabilize the characteristics of the MOS transistor, the side wall 20 consisting of the oxide film is formed on the side wall of each gate electrode wiring line 3. The n$^+$-type diffusion layer 1 and the p$^+$-type diffusion layer 2 are respectively formed on the p-type well layer 7 and the n-type well layer 8 by a well-known technique such as ion implantation. Thereafter, the interlayer film, the contact holes 4, and the metal Al wiring lines 6 on the first layer are formed (FIG. 11F).

Figure 12:
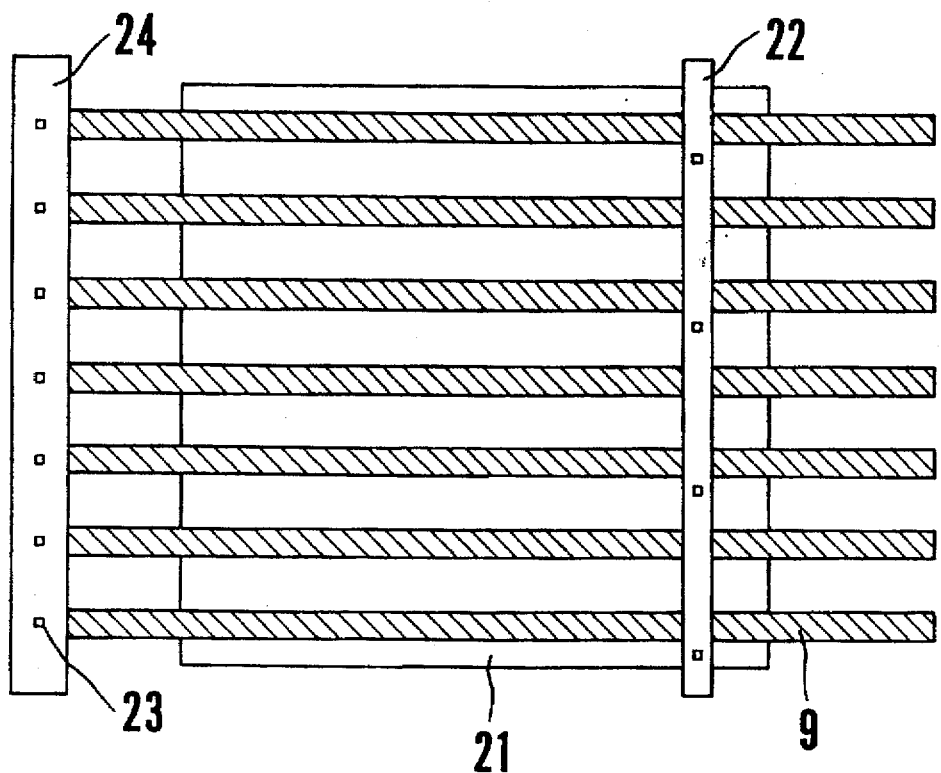
FIG. 12 is a view showing an arrangement for supplying an external ground potential to a memory cell block.

FIG. 12 shows an arrangement for supplying an external ground potential to a memory cell block to a conductive film such as the polysilicon film 16.

Referring to FIG. 12, a memory cell block 21 is constituted by Y memory cells in the longitudinal direction and X memory cells in the transverse direction. The memory cell block 21 has Y (7 in FIG. 12 for illustrative convenience) trench isolating portions 9 and X (1 in FIG. 12 for illustrative convenience) ground potential wiring lines 22 in the memory cells. The ground potential of the trench capacitors is supplied from a ground potential wiring line 24 located outside the memory cell block 21 through capacitor ground potential contacts 23.

The steps of manufacturing the capacitor ground potential contacts 23 will be described below with reference to steps (g) to (j) in FIGS. 13G to 13J.

Figure 13G:
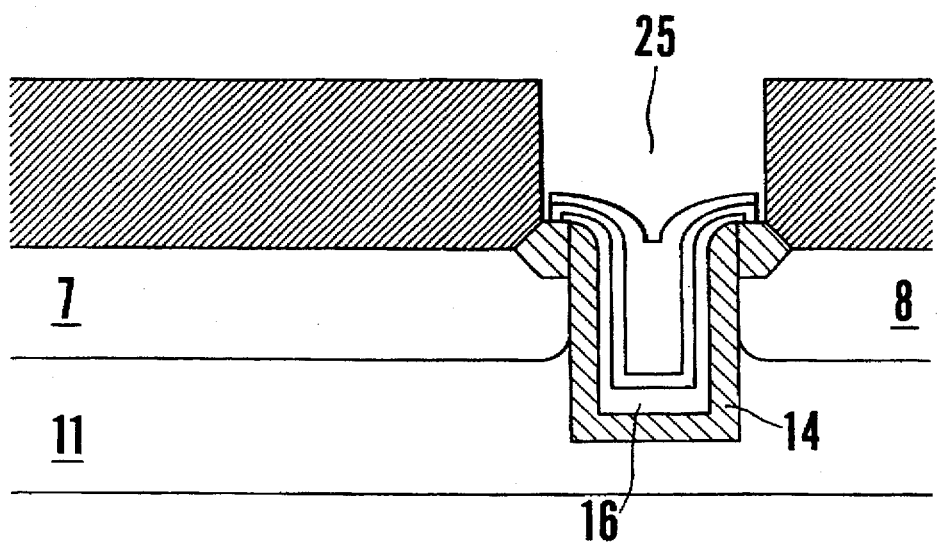
FIGS. 13G to 13J are sectional views showing the steps of manufacturing ground potential contacts 23 for capacitors.

(g) After the memory cell is manufactured up to the steps in FIGS. 11A to 11E, the resultant structure is masked with a resist 25 (FIG. 13G).

Figure 13H:
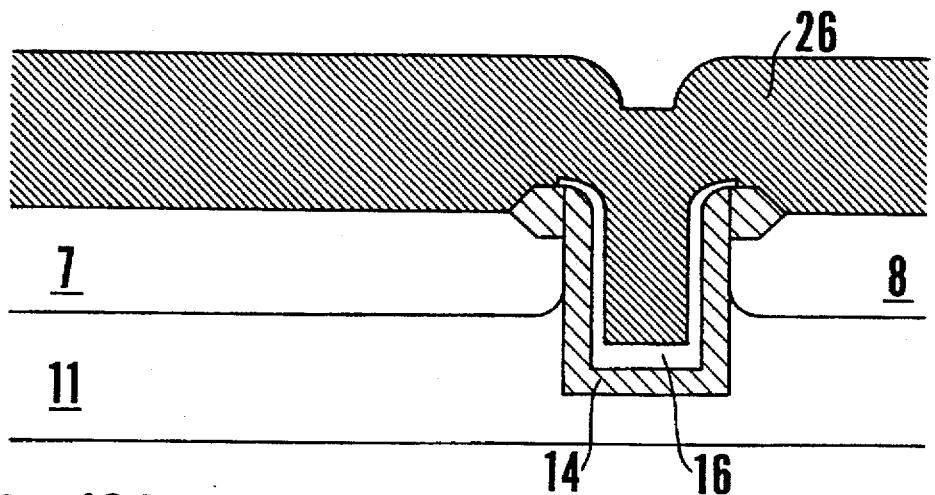

(h) The polysilicon film 18 is wet-etched, and the nitride film 17 is dry-etched. An interlayer film 26 such as an oxide film is formed (FIG. 13H).

Figure 13I:
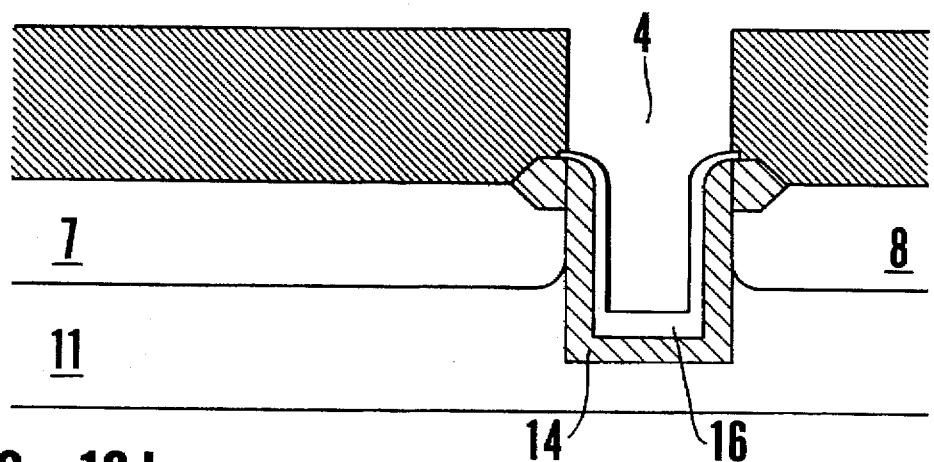

(i) The contact hole 4 is formed by micropatterning techniques such as optical exposure and dry etching (FIG. 13I).

Figure 13J:
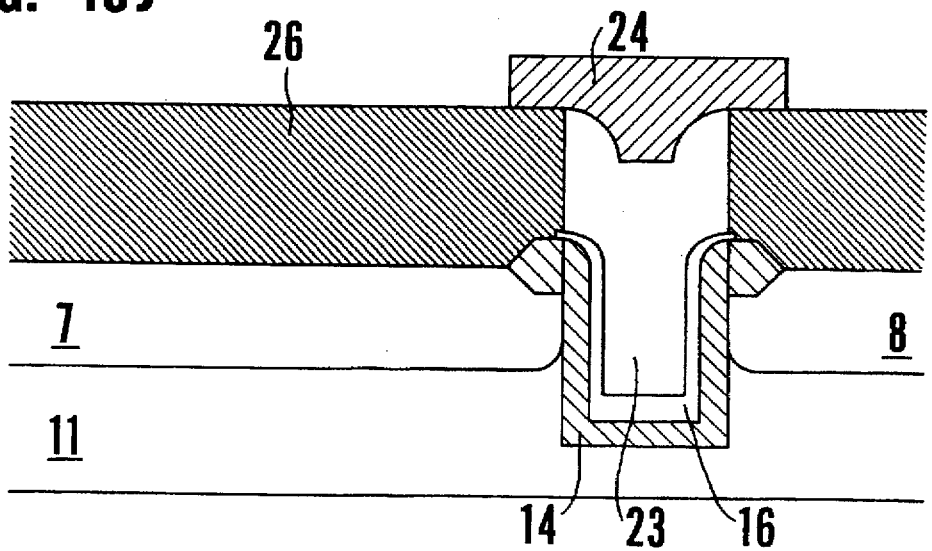

(j) Polysilicon or tungsten is buried in the contact hole 4 to form the capacitor ground potential contact 23. The capacitor ground potential wiring line 24 which consists of aluminum or tungsten is formed on the capacitor ground potential contacts 23 (FIG. 13J).

In this manner, the ground potential to be supplied to the trench capacitor is isolated from the ground potential in the memory cell, so that electric charges stored in the trench capacitor are stabilized without being adversely affected by the functional operation of the memory, thereby improving the soft error immunity.

The above example can also be realized by an arrangement of a Bi-CMOS integrated circuit which has features of both a CMOS transistor and a bipolar transistor with a high-speed operation and a high driving ability, and in which the bipolar transistor and the CMOS transistor are formed on the same substrate.

As has been described above, in the semiconductor memory device (static memory) constituted by the bulk CMOS 6-Tr memory cells according to the present invention, the trench isolating region for electrically isolating the first conductive well from the second conductive well is formed to decrease the cell size. Moreover, the trench capacitor formed inside the trench isolating region is connected to the memory nodes in the memory cell to increase the capacitances of the memory nodes. With this arrangement, a high soft error immunity can be maintained even if a power-supply voltage is lowered and a cell size is decreased.

What we claimed is:

1. A semiconductor memory device having a flip-flop circuit constituted by coupling an input end of a first CMOS inverter and an output end of a second CMOS inverter to a first node and an output end of said first CMOS inverter and an input node of said second CMOS inverter to a second node, said semiconductor device comprising:

a semiconductor body;

a first region of an N-type selectively formed in said semiconductor body and having therein a P-channel transistor of each of said first and second CMOS inverters;

a second region of a P-type selectively formed in said semiconductor body and having therein an N-channel transistor of each of said first and second CMOS inverters;

a trench isolation region provided between said first and second regions to isolate said first and second regions from each other, said trench isolation region including a first groove selectively formed in said semiconductor body between said first and second regions and a layer filling said first groove;

a second groove and a third groove selectively formed apart from each other in said layer of said trench isolation region;

a first capacitor formed in said second groove and coupled to said first node, said first capacitor including a first lower electrode layer, a first dielectric layer on said first lower electrode layer and a first upper electrode layer on said first dielectric layer; and a second capacitor formed in said third groove and coupled to said second node, said second capacitor including a second lower electrode layer, a second dielectric layer on said second lower electrode layer and a second upper electrode layer on said second dielectric layer.

2. A device according to claim 1, wherein said first lower electrode layer electrically connects to a ground potential through contact with the semiconductor body at a bottom of said first groove.

3. A device according to claim 2, wherein said second lower electrode layer electrically connects to the ground potential through contact with the semiconductor body at a bottom of said second groove.

4. A device according to claim 1, wherein said first lower electrode layer is insulated from the semiconductor body at a bottom of said first groove and has a structure for supplying an external ground potential as a first ground wiring line.

5. A device according to claim 4, wherein said second lower electrode layer is insulated from the semiconductor body at a bottom of said second groove and has a structure for supplying the external ground potential as a second ground wiring line.

* * * * *